US012585856B2

(12) United States Patent
Liang et al.

(10) Patent No.: US 12,585,856 B2
(45) Date of Patent: Mar. 24, 2026

(54) TECHNIQUES FOR GENERATING DESIGNS OF CIRCUITS THAT INCLUDE BUFFERS USING MACHINE LEARNING

(71) Applicant: NVIDIA CORPORATION, Santa Clara, CA (US)

(72) Inventors: Rongjian Liang, Austin, TX (US); Haoxing Ren, Austin, TX (US)

(73) Assignee: NVIDIA CORPORATION, Santa Clara, CA (US)

( * ) Notice: Subject to any disclaimer, the term of this patent is extended or adjusted under 35 U.S.C. 154(b) by 699 days.

(21) Appl. No.: 17/982,364

(22) Filed: Nov. 7, 2022

(65) Prior Publication Data

US 2024/0104283 A1 Mar. 28, 2024

Related U.S. Application Data

(60) Provisional application No. 63/376,740, filed on Sep. 22, 2022.

(51) Int. Cl.
*G06F 30/392* (2020.01)
(52) U.S. Cl.
CPC ................................. *G06F 30/392* (2020.01)
(58) Field of Classification Search
USPC .......................................... 716/120
See application file for complete search history.

(56) References Cited

U.S. PATENT DOCUMENTS

2008/0141206 A1* 6/2008 He ......................... G06F 30/327
716/133
2019/0065657 A1* 2/2019 Chung .................. G06F 16/275

OTHER PUBLICATIONS

Agiza et al., "OpenPhySyn: An Open-Source Physical Synthesis Optimization Toolkit", WOSET, 2020, 4 pages.
Chu et al., "FLUTE: Fast Lookup Table based Rectilinear Steiner Minimal Tree Algorithm for VLSI Design", IEEE, TCAD, 2007, 14 pages.
Cong et al., "Routing Tree Construction Under Fixed Buffer Locations", in Proc. DAC, 2000, pp. 379-384.
Dueck, Delbert, "Affinity Propagation: Clustering Data by Passing Messages", Graduate Department of Electrical & Computer Engineering, 2009, 154 pages.
Murtagh et al., "Ward's Hierarchical Agglomerative Clustering Method: Which Algorithms Implement Ward's Criterion?", DOI:10.1007/s00357-014-9161-z, Journal of Classification, vol. 31, No. 3, 2014, pp. 274-295.
Sener et al., "Multi-Task Learning as Multi-Objective Optimization", arXiv:1810.04650, Oct. 10, 2018, 15 pages.

(Continued)

*Primary Examiner* — Bryce M Aisaka
(74) *Attorney, Agent, or Firm* — Artegis Law Group, LLP

(57) ABSTRACT
Techniques are disclosed herein for designing a circuit. The techniques include receiving a specification for a driver and a plurality of sinks; executing, based on the driver and the plurality of sinks, a machine learning model that predicts at least one of a size, a location, or a delay target of one or more buffers; generating a tree that includes a plurality of nodes representing the driver, the plurality of sinks, and the one or more buffers between the driver and one or more of the sinks; and generating a design of a circuit based on the tree.

20 Claims, 10 Drawing Sheets

(56) References Cited

OTHER PUBLICATIONS

Stefanidis et al., "Autonomous Application of Netlist Transformations inside Lagrangian Relaxation-based Optimization", DOI10.1109/TCAD.2020.3025541, vol. 40, No. 8, 2020, 14 pages.

Vaswani et al., "Attention is All You Need", 31st Conference on Neural Information Processing Systems, 2017, 11 pages.

Alpert et al., "Wire Segmenting for Improved Buffer Insertion", in Proc. DAC., 1997, pp. 588-593.

Alpert et al., "Steiner Tree Optimization for Buffers, Blockages, and Bays", IEEE Transactions on Computer-Aided Design of Integrated Circuts and Systems, vol. 20, No. 4, Apr. 2001, pp. 556-562.

Alpert et al., "Accurate Estimation of Global Buffer Delay within a Floorplan", IEEE Transactions on Computer-Aided Design of Integrated Circuits and Systems, vol. 25, No. 6, Jun. 2006, pp. 1140-1145.

Li et al., "Making Fast Buffer Insertion Even Faster Via Approximation Techniques", in Proc. ASP-DAC, vol. 1, 2005, pp. 13-18.

Alpert et al., "Prim-Dijkstra Revisited: Achieving Superior Timing-driven Routing Trees", https://doi.org/10.1145/3177540.3178239, ISPD'18, Mar. 25-28, 2018, pp. 10-17.

Schubert et al., "DBSCAN Revisited, Revisited: Why and How You Should (Still) Use DBSCAN", https://doi.org/10.1145/3068335, ACM Transactions on Database Systems, vol. 42, No. 3, Article 19, Jul. 2017, pp. 19:1-19:21.

Van Ginneken, Lukas p. P.P., "Buffer Placement in Distributed RC-Tree Networks for Minimal Elmore Delay", International Business Machines Corporation, 1990, pp. 865-868.

Lillis et al., "Optimal Wire Sizing and Buffer Insertion for Low Power and a Generalized Delay Model", IEEE Journal of Solid-State Circuits, vol. 31, No. 3, Mar. 1996, pp. 437-447.

Yan et al., "Towards Machine Learning for Placement and Routing in Chip Design: a Methodological Overview", arXiv:2202.13564, Feb. 28, 2022, 9 pages.

Mui et al., "A Global Interconnect Optimization Scheme for Nanometer Scale VLSI With Implications for Latency, Bandwidth, and Power Dissipation", IEEE Transactions on Electron Devices, vol. 51, No. 2, Feb. 2004, pp. 195-203.

Saxena et al., "Repeater Scaling and Its Impact on CAD", IEEE Transactions on Computer-Aided Design of Integrated Circuits and Systems, DOI10.1109/TCAD.2004.825841, vol. 23, No. 4, Apr. 2004, pp. 451-463.

Chen et al., "Efficient Algorithms for Buffer Insertion in General Circuits Based on Network Flow", ICCAD, IEEE, 2005, pp. 322-326.

Hu et al., "A Fully Polynomial Time Approximation Scheme for Timing Driven Minimum Cost Buffer Insertion", DAC'09, Jul. 26-31, 2009, pp. 424-429.

Nath et al., "Invited: Generative Self-Supervised Learning for Gate Sizing", Association for Computing Machinery, https://doi.org/10.1145/3489517.3530645, Jul. 10-14, 2022, pp. 1331-1334.

Lin et al., "Focal Loss for Dense Object Detection", ICCV, 2017, pp. 2980-2988.

Shi et al., "Complexity Analysis and Speedup Techniques for Optimal Buffer Insertion with Minimum Cost", in Proc. ASP-DAC., 2004, pp. 609-614.

Liu et al., "Self-supervised Learning: Generative or Contrastive", arXiv:2006.08218, Mar. 20, 2021, 24 pages.

Jiang et al., "Circuit-wise Buffer Insertion and Gate Sizing Algorithm with Scalability", DAC 2008, Jun. 8-13, 2008, pp. 708-713.

* cited by examiner

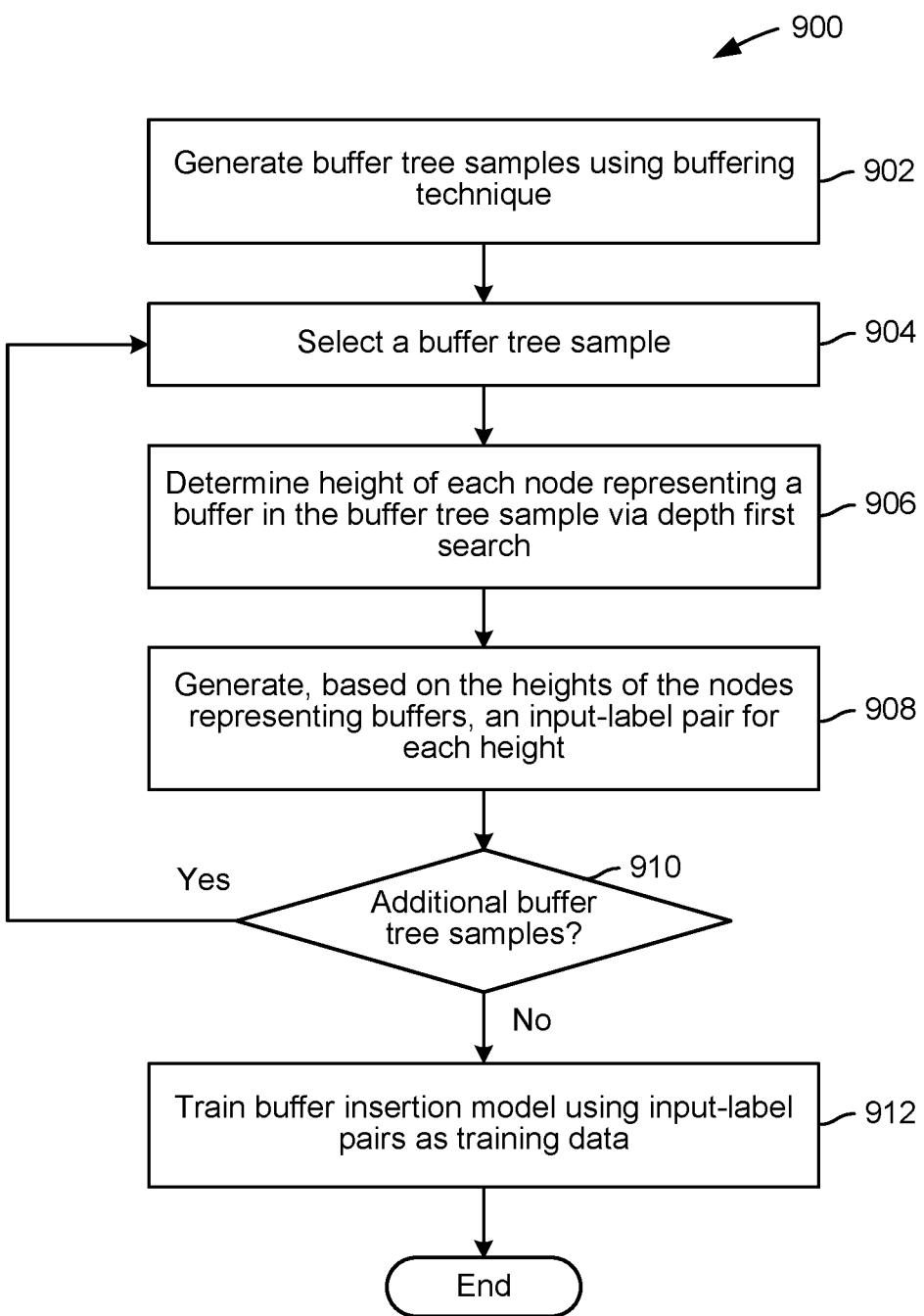

900

Generate buffer tree samples using buffering technique ~ 902

Select a buffer tree sample ~ 904

Determine height of each node representing a buffer in the buffer tree sample via depth first search ~ 906

Generate, based on the heights of the nodes representing buffers, an input-label pair for each height ~ 908

910

Additional buffer tree samples?

Yes

No

Train buffer insertion model using input-label pairs as training data ~ 912

End

FIG. 9

TECHNIQUES FOR GENERATING DESIGNS OF CIRCUITS THAT INCLUDE BUFFERS USING MACHINE LEARNING

CROSS-REFERENCE TO RELATED APPLICATIONS

This application claims priority benefit of the United States Provisional Patent Application titled, "GENERATIVE MACHINE-LEARNING TECHNIQUES FOR BUFFERING," filed on Sep. 22, 2022, and having Ser. No. 63/376,740. The subject matter of this related application is hereby incorporated herein by reference.

BACKGROUND

Technical Field

Embodiments of the present disclosure relate generally to artificial intelligence/machine learning and circuit design and, more specifically, to techniques for generating designs of circuit that include buffers using machine learning.

Description of the Related Art

A buffer is a device that reduces the wire delay from one component of a circuit to another by restoring the strength of a signal being transmitted across a wire. A buffer can also shield capacitive loads from a timing-critical path to reduce the interconnect delay along that path. The use of buffers in a circuit is referred to as "buffering." Buffering improves the timing with which signals are transmitted across components of a given circuit. The improvement in timing can be critical, for example, to match the clock cycle of a processor, among other things. However, buffering requires power, and excessive buffering can waste power.

One conventional approach for designing a circuit that includes buffers is net-level buffering. As used herein, a "net" represents the connection between a set of pins in a circuit. In conventional net-level buffering techniques, a tree is first constructed for each net in a circuit to represent pins and candidate buffer insertion locations. Then, a dynamic programming technique is performed to solve the optimization problem of determining the sizes and locations of buffers to insert into the tree. Once the tree for each net is complete, the circuit is designed and implemented based on the tree(s) for the net(s).

One drawback of the above approach is that constructing each tree and executing the dynamic programing technique to determine the sizes and locations of buffers to insert into each tree is very computationally expensive, even when various approximations and heuristics are used to improve computational performance. As a result, significant amounts of time and computational resources are required to design a circuit. In addition, the above approach does not, as a general matter, scale well with circuits that include a large number of pins.

As the foregoing illustrates, what is needed in the art are more effective techniques for designing circuits that include buffers.

SUMMARY

One embodiment of the present disclosure sets forth a computer-implemented method for designing a circuit. The method includes receiving a specification for a driver and a plurality of sinks. The method also includes executing, based on the driver and the plurality of sinks, a machine learning model that predicts at least one of a size, a location, or a delay target of one or more buffers. The method further includes generating a tree that includes a plurality of nodes representing the driver, the plurality of sinks, and the one or more buffers between the driver and one or more of the sinks. In addition, the method includes generating a design of a circuit based on the tree.

Other embodiments of the present disclosure include, without limitation, one or more computer-readable media including instructions for performing one or more aspects of the disclosed techniques as well as one or more computing systems for performing one or more aspects of the disclosed techniques.

At least one technical advantage of the disclosed techniques relative to the prior art is that the disclosed techniques can be used to generate designs of circuits that include buffers in less time, and using less computational resources, than conventional techniques. The disclosed techniques also scale better than conventional techniques for circuits that include a large number of pins, because the disclosed techniques permit a buffer-embedded tree of height N to be constructed in N steps. These technical advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 9 is a flow diagram of method steps for training a buffer insertion machine learning model, according to various embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

General Overview

Embodiments of the present disclosure provide techniques for training and applying a machine learning model to generate designs of circuits that include buffers. In some embodiments, a buffer-embedded tree (also sometimes referred to herein as a "tree") for a net is generated via a recursive process in which a buffer insertion machine learning model is applied, at a number of levels, to insert nodes representing buffers between nodes representing a driver and sinks in the tree. At a first level, features associated with the driver and the sinks are inserted into the buffer insertion model. The buffer insertion model clusters the sinks and predicts, for each cluster of sinks, the size of a new buffer (or that no new buffer is required), a location of the new buffer, and a delay target for the new buffer. At subsequent levels, the new buffers, if any, are considered as dummy sinks. Features associated with the new buffers are input, along with features associated with the driver and other sinks for which no new buffers were required, into the buffer insertion model to generate additional buffers for the subsequent levels. Once a tree is generated for each of one or more nets, a circuit design can be generated based on the tree(s).

In some embodiments, the buffer insertion model is trained via a self-supervised training scheme in which embedded tree samples are generated using a buffering technique, such as a conventional dynamic programming technique. Then, input-label pairs are generated from the tree samples and used as training data to train the buffer insertion model.

The disclosed techniques for training and utilizing a machine learning model to generate designs of circuits can be applied to generate various types of circuits, such as very large-scale integration (VSLI) circuits, that include buffers. The circuits can be included in processors and control systems for various devices, among other things.

The above examples are not in any way intended to be limiting. As persons skilled in the art will appreciate, as a general matter, the techniques for generating designs of circuits can be implemented in any suitable application.

System Overview

Figure 1:
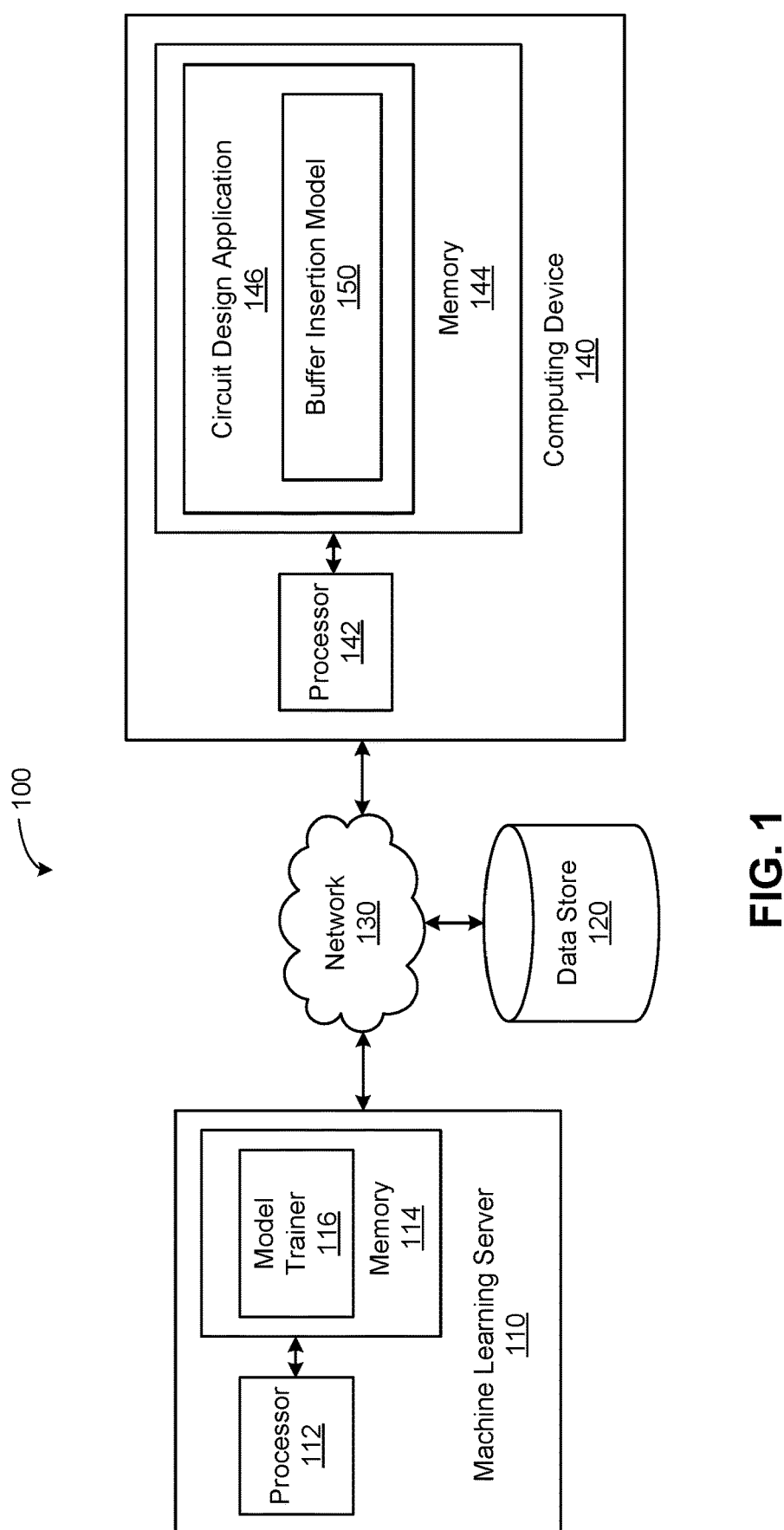
FIG. 1 is a block diagram illustrating a computer system configured to implement one or more aspects of the various embodiments.

FIG. 1 illustrates a system 100 configured to implement one or more aspects of the various embodiments. As shown, the system 100 includes a machine learning server 110, a data store 120, and a computing device 140 in communication over a network 130, which can be a wide area network (WAN) such as the Internet, a local area network (LAN), or any other suitable network. In addition, the system 100 includes a robot 160 and one or more sensors 180₁ (referred to herein collectively as sensors 180 and individually as a sensor 180) that are in communication with the computing device 140 (e.g., via a similar network). In some embodiments, the sensors can include one or more RGB (red, green, blue) cameras and optionally one or more depth cameras, such as cameras using time-of-flight sensors, LIDAR (light detection and ranging) sensors, etc.

As shown, a model trainer 116 executes on a processor 112 of the machine learning server 110 and is stored in a system memory 114 of the machine learning server 110. The processor 112 receives user input from input devices, such as a keyboard or a mouse. In operation, the processor 112 is the master processor of the machine learning server 110, controlling and coordinating operations of other system components. In particular, the processor 112 can issue commands that control the operation of a graphics processing unit (GPU) (not shown) that incorporates circuitry optimized for graphics and video processing, including, for example, video output circuitry. The GPU can deliver pixels to a display device that can be any conventional cathode ray tube, liquid crystal display, light-emitting diode display, or the like.

The system memory 114 of the machine learning server 110 stores content, such as software applications and data, for use by the processor 112 and the GPU. The system memory 114 can be any type of memory capable of storing data and software applications, such as a random access memory (RAM), a read-only memory (ROM), an erasable programmable read-only memory (EPROM or Flash ROM), or any suitable combination of the foregoing. In some embodiments, a storage (not shown) can supplement or replace the system memory 114. The storage can include any number and type of external memories that are accessible to the processor 112 and/or the GPU. For example, and without limitation, the storage can include a Secure Digital Card, an external Flash memory, a portable compact disc read-only memory (CD-ROM), an optical storage device, a magnetic storage device, or any suitable combination of the foregoing.

It will be appreciated that the machine learning server 110 shown herein is illustrative and that variations and modifications are possible. For example, the number of processors 112, the number of GPUs, the number of system memories 114, and the number of applications included in the system memory 114 can be modified as desired. Further, the connection topology between the various units in FIG. 1 can be modified as desired. In some embodiments, any combination of the processor 112, the system memory 114, and a GPU can be replaced with any type of virtual computing system, distributed computing system, or cloud computing environment, such as a public, private, or a hybrid cloud.

In some embodiments, the model trainer 116 is configured to train one or more machine learning models, including a buffer insertion model 150. The buffer insertion model 150 takes as input features associated with a driver and sinks, and the buffer insertion model 150 outputs the sizes, locations, and delay targets of buffers between the driver and the sinks. The buffer insertion model 150 can be used to recursively generate a buffer-embedded tree that includes nodes representing one or more buffers between a driver and any number of sinks. In turn, the buffer-embedded tree can be used to generate a design of a circuit. An exemplar architecture of the buffer insertion model 150 is discussed below in conjunction with FIG. 3. Techniques for generating training data and training the buffer insertion model 150 are discussed below in conjunction with FIGS. 8A-8D and 9. Training data and/or trained machine learning models can be stored in the data store 120. In some embodiments, the data store 120 can include any storage device or devices, such as fixed disc drive(s), flash drive(s), optical storage, network attached storage (NAS), and/or a storage area-network (SAN). Although shown as accessible over the network 130, in some embodiments the machine learning server 110 can include the data store 120.

As shown, a circuit design application 146 that utilizes the buffer insertion model 150 is stored in a memory 144, and executes on a processor 142, of the computing device 140. Once trained, the buffer insertion model 150 can be deployed to any suitable application, such as the circuit design application 146.

Figure 2:
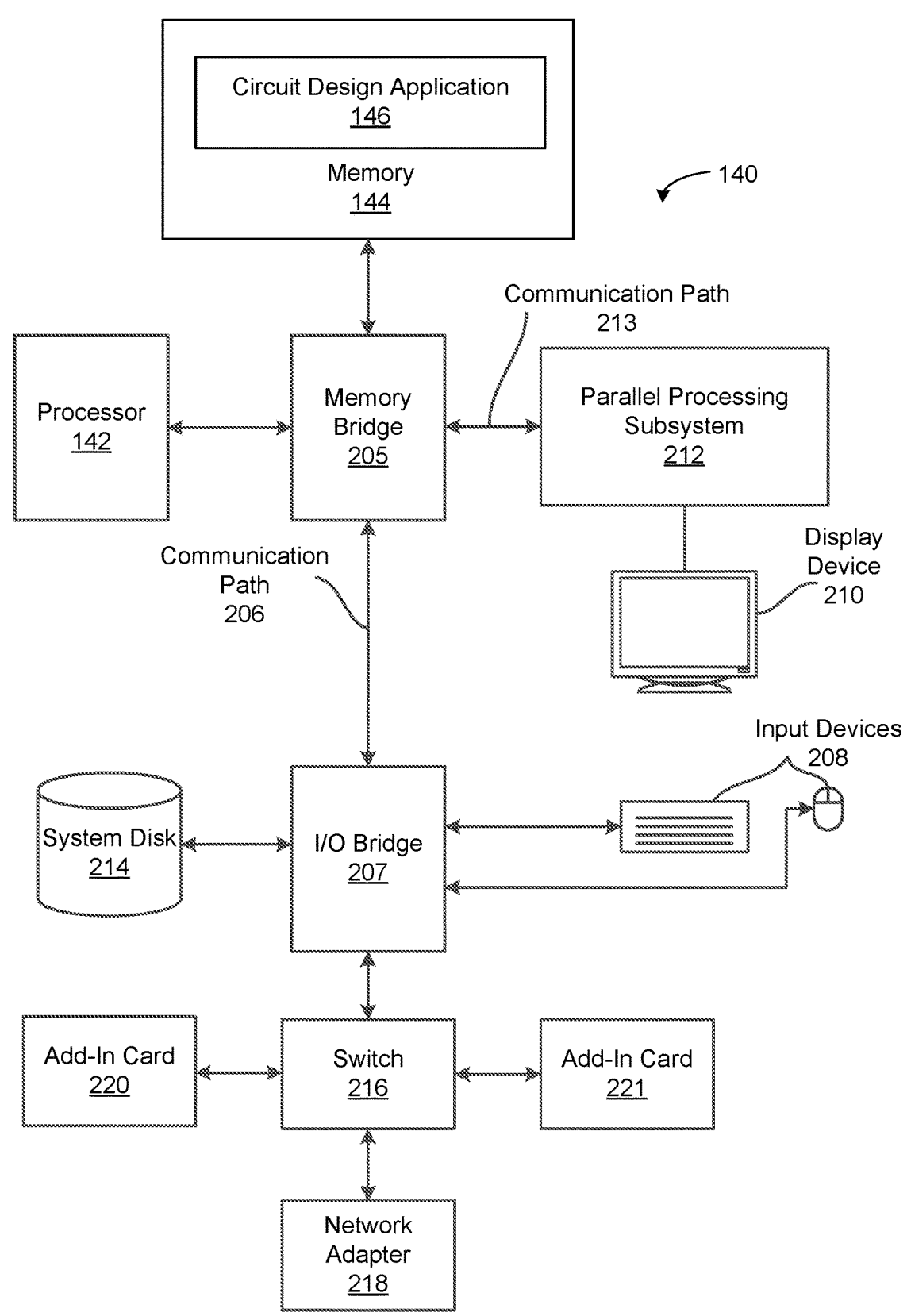
FIG. 2 is a more detailed illustration of the computing device of FIG. 1, according to various embodiments.

FIG. 2 is a more detailed illustration of the computing device 140 of FIG. 1, according to various embodiments. As persons skilled in the art will appreciate, computing device 140 can be any type of technically feasible computer system, including, without limitation, a server machine, a server platform, a desktop machine, laptop machine, a hand-held/mobile device, or a wearable device. In some embodiments, computing device 140 is a server machine operating in a data center or a cloud computing environment that provides scalable computing resources as a service over a network. In some embodiments, the machine learning server 110 can include similar components as the computing device 140.

In various embodiments, the computing device 140 includes, without limitation, the processor 142 and the memory 144 coupled to a parallel processing subsystem 212 via a memory bridge 205 and a communication path 213. Memory bridge 205 is further coupled to an I/O (input/output) bridge 207 via a communication path 206, and I/O bridge 207 is, in turn, coupled to a switch 216.

In one embodiment, I/O bridge 207 is configured to receive user input information from optional input devices 208, such as a keyboard or a mouse, and forward the input information to processor 142 for processing via communication path 206 and memory bridge 205. In some embodiments, computing device 140 may be a server machine in a cloud computing environment. In such embodiments, computing device 140 may not have input devices 208. Instead, computing device 140 may receive equivalent input information by receiving commands in the form of messages transmitted over a network and received via the network adapter 218. In one embodiment, switch 216 is configured to provide connections between I/O bridge 207 and other components of the computing device 140, such as a network adapter 218 and various add-in cards 220 and 221.

In one embodiment, I/O bridge 207 is coupled to a system disk 214 that may be configured to store content and applications and data for use by processor 142 and parallel processing subsystem 212. In one embodiment, system disk 214 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. In various embodiments, other components, such as universal serial bus or other port connections, compact disc drives, digital versatile disc drives, film recording devices, and the like, may be connected to I/O bridge 207 as well.

In various embodiments, memory bridge 205 may be a Northbridge chip, and I/O bridge 207 may be a Southbridge chip. In addition, communication paths 206 and 213, as well as other communication paths within computing device 140, may be implemented using any technically suitable protocols, including, without limitation, AGP (Accelerated Graphics Port), HyperTransport, or any other bus or point-to-point communication protocol known in the art.

In some embodiments, parallel processing subsystem 212 comprises a graphics subsystem that delivers pixels to an optional display device 210 that may be any conventional cathode ray tube, liquid crystal display, light-emitting diode display, or the like. In such embodiments, the parallel processing subsystem 212 incorporates circuitry optimized for graphics and video processing, including, for example, video output circuitry. As described in greater detail below in conjunction with FIGS. 2-3, such circuitry may be incorporated across one or more parallel processing units (PPUs), also referred to herein as parallel processors, included within parallel processing subsystem 212. In other embodiments, the parallel processing subsystem 212 incorporates circuitry optimized for general purpose and/or compute processing. Again, such circuitry may be incorporated across one or more PPUs included within parallel processing subsystem 212 that are configured to perform such general purpose and/or compute operations. In yet other embodiments, the one or more PPUs included within parallel processing subsystem 212 may be configured to perform graphics processing, general purpose processing, and compute processing operations. System memory 144 includes at least one device driver configured to manage the processing operations of the one or more PPUs within parallel processing subsystem 212. In addition, the system memory 144 includes the circuit design application 146, described above in conjunction with FIG. 1.

In various embodiments, parallel processing subsystem 212 may be integrated with one or more of the other elements of FIG. 1 to form a single system. For example, parallel processing subsystem 212 may be integrated with processor 142 and other connection circuitry on a single chip to form a system on chip (SoC).

In one embodiment, processor 142 is the master processor of computing device 140, controlling and coordinating operations of other system components. In one embodiment, processor 142 issues commands that control the operation of PPUs. In some embodiments, communication path 213 is a PCI Express link, in which dedicated lanes are allocated to each PPU, as is known in the art. Other communication paths may also be used. PPU advantageously implements a highly parallel processing architecture. A PPU may be provided with any amount of local parallel processing memory (PP memory).

It will be appreciated that the system shown herein is illustrative and that variations and modifications are possible. The connection topology, including the number and arrangement of bridges, the number of processors (e.g., processor 142), and the number of parallel processing subsystems 212, may be modified as desired. For example, in some embodiments, system memory 144 could be connected to processor 142 directly rather than through memory bridge 205, and other devices would communicate with system memory 144 via memory bridge 205 and processor 142. In other embodiments, parallel processing subsystem 212 may be connected to I/O bridge 207 or directly to processor 142, rather than to memory bridge 205. In still other embodiments, I/O bridge 207 and memory bridge 205 may be integrated into a single chip instead of existing as one or more discrete devices. In certain embodiments, one or more components shown in FIG. 1 may not be present. For example, switch 216 could be eliminated, and network adapter 218 and add-in cards 220, 221 would connect directly to I/O bridge 207. Lastly, in certain embodiments, one or more components shown in FIG. 1 may be implemented as virtualized resources in a virtual computing environment, such as a cloud computing environment. In particular, the parallel processing subsystem 212 may be implemented as a virtualized parallel processing subsystem in some embodiments. For example, the parallel processing subsystem 212 could be implemented as a virtual graphics processing unit (GPU) that renders graphics on a virtual machine (VM) executing on a server machine whose GPU and other physical resources are shared across multiple VMs.

Generating Designs of Circuits that Include Buffers Using Machine Learning

Figure 3:
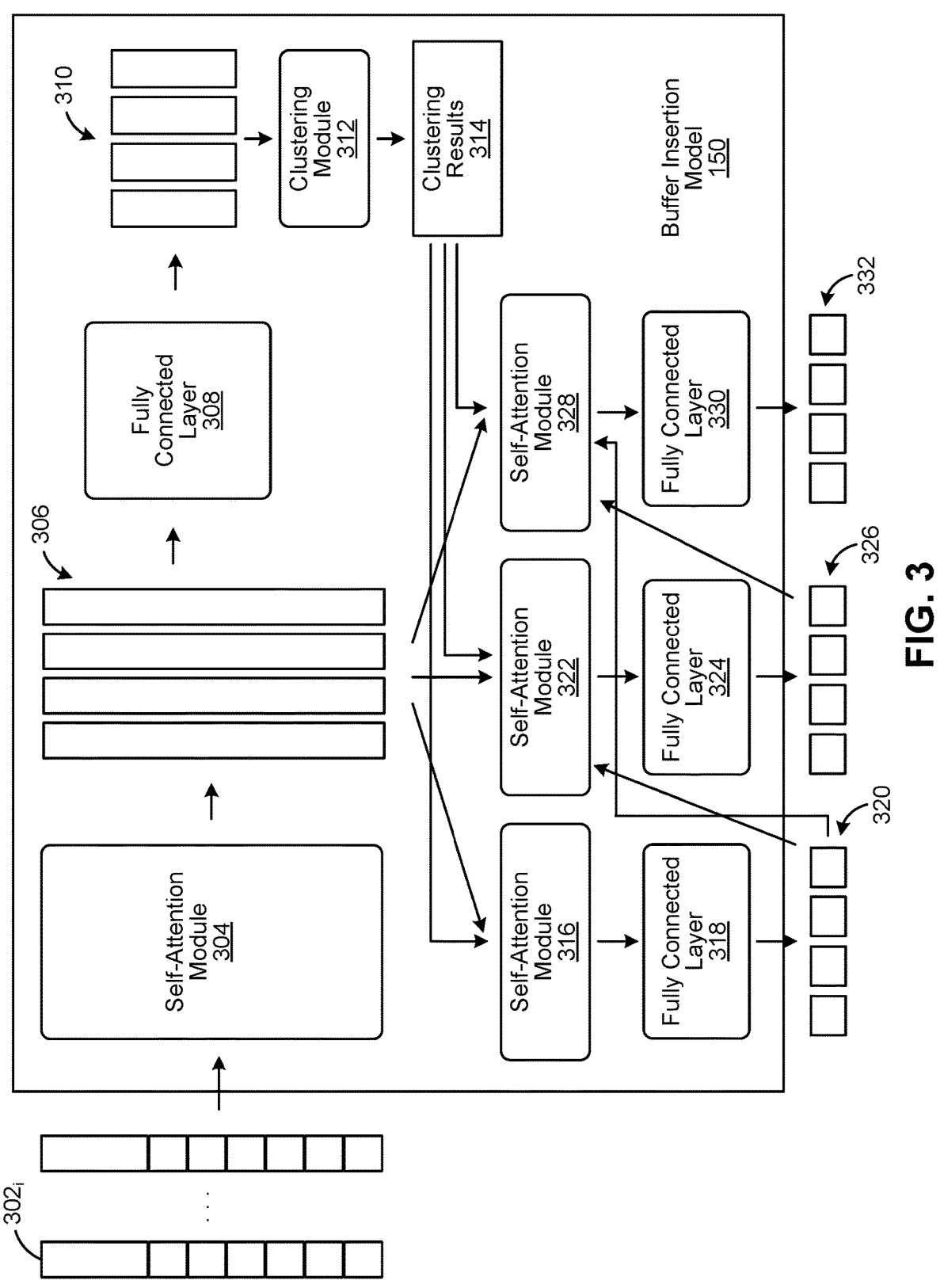
FIG. 3 is a more detailed illustration of the buffer insertion model of FIG. 1, according to various embodiments.

FIG. 3 is a more detailed illustration of the buffer insertion model 150 of FIG. 1, according to various embodiments. As shown, the buffer insertion model 150 includes a self-attention module 304; a fully connected layer 308; a clustering module 312; another three self-attention modules 316, 322, and 328; and another three fully connected layers 318, 324, and 330. In some embodiments, given information about a driver and sinks, the buffer insertion model 150 is responsible for four tasks: (1) clustering the sinks, (2) determining the sizes of buffers/inverters (or that no buffer is needed) for each cluster, (3) determining the locations of the new buffers within a net, and (2) determining delay targets for the new buffers. As described, the net represents the connection between a set of pins in a circuit. As used herein, a "delay target" from an input pin of a driver to a sink or buffer is the required arrival time for the sink or buffer assuming the arrival time at the input pin of the driver is 0. Each of the four tasks performed by the buffer insertion model 150 can be viewed as a sequence-to-sequence "translation" between different domains. The clustering task in particular requires aggregating information of the driver and all of the sinks. Accordingly, the buffer insertion model 150 is a customization of a transformer-based architecture in some embodiments. Additionally, in some embodiments, execution of the buffer insertion model 150 can be accelerated via one or more GPUs.

Transformer is a generative neural network architecture relying on the attention mechanism for sequence-to-sequence mapping. The attention mechanism permits a neural network model to focus on the most relevant parts of data while ignoring other parts of the data in a trainable manner. In particular, self-attention on the input sequence, which involves calculating attention of all other inputs with respect to each input, permits inputs to interact with each other to learn representations that capture both global and local information. Mathematically, the attention operation for input matrices (Q, K, V) is calculated as:

$$\text{Attention}(Q, K, V) = \text{Softmax}\left(\text{Mask}\left(\frac{QK^T}{\sqrt{d}}\right)\right)V, \tag{1}$$

where Q, K, V are the concatenation of query, key, and value vectors, which can be obtained by applying linear transformations to input vectors, and d is the dimension of the query/key/value vectors. In equation (1), Mask refers to adding negative infinity to specific elements such that the corresponding elements will become zeroes after the Softmax operation, meaning those elements have no effect on the output. In some cases, Mask operators can be customized by users to integrate prior knowledge, e.g., specific part of inputs is not relevant to other parts of inputs, to a model.

As shown, the buffer insertion model 150 takes as input features associated with a driver and one or more sinks. Illustratively, the features are in the form of feature vectors 3021 (referred to herein collectively as feature vectors 302 and individually as a feature vector 302) for each of the driver and the one or more sinks. Each sink represented by a feature vector 302 can be an actual sink or a previously inserted buffer that is used as a dummy sink. Given a driver and one or more actual sinks, the goal of buffering is to build a tree, associated with a net, that (1) connects the driver to the sink(s), and (2) includes one or more nodes representing buffers that reduce the wire delay. In some embodiments, each feature vector 302 indicates, for the driver or one of the (dummy) sinks, an embedding for the cell type, an input slew (−1 for sinks), an input capacitance (−1 for the driver), a relative location and distance to the driver, a flag indicating whether the feature vector is associated with the driver or a (dummy) sink, a delay target (0 for the driver), and a parity (+for the driver). In such cases, the capacitance and slew can be implicitly modeled by training the buffer insertion model 140 with legal samples. In addition, input normalization can be applied in some embodiments, because the magnitudes of different features in the feature vectors 302 may vary.

The self-attention module 304 processes the feature vectors 302 and incorporates the information about the driver and the sinks therein to generate an intermediate representation of the sinks 306. The self-attention module 304, and the other self-attention modules 316, 322, and 328, each include a series of self-attention layers of artificial neurons. Although described herein primarily with respect to self-attention modules, other sequence-to-sequency translation modules, such as one or more long-short term memories that include layers of artificial neurons, can be used in some embodiments.

Illustratively, the intermediate representation of the sinks 306 that is generated by the self-attention module 304 is shared and used for all four of the tasks, described above, that are performed by the buffer insertion module 150. Individual modules, namely the fully connected layers 308 and the self-attention modules 316, 322, and 328, along with the corresponding fully connected layers 318, 324, and 330, perform each of the four tasks. As the tasks are related to each other, the same representation that is used for one task might benefit other tasks too. In addition, sharing the self-attention module 304 can reduce the total number of parameters in the buffer insertion model 150, thereby using less memory and permitting faster training and inference.

The fully connected layer 308 processes the intermediate representation of the sinks 306 to generate a representation of the sinks for clustering 310. The clustering module 312 processes the representation of the sinks for clustering 310 to generate clustering results 314. The clustering model 312 can apply any technically feasible clustering technique to generate the clustering results 314. In some embodiments, the clustering technique includes first computing a cosine similarity between each pair of sinks. Pairs of sinks having a cosine similarity higher than a given threshold are regarded as connected. Then, connected components among sinks are determined. If a connected component includes sinks with different parities, then the connected component is split into two parts according to the parities of the sinks. Each remaining component is considered a cluster. It should be noted that such a clustering technique does not require a predefined number of clusters, and the clustering technique can also enforce the parity constraint (i.e., the number of inverters on the path from the driver to thee sink is even if and only if the sink has parity+). In addition, such a clustering technique can be implemented as a series of matrix operations that can be accelerated via a GPU.

The clustering results 314 are used to guide the other tasks performed by the buffer insertion model 150. Specifically, for each sink cluster, the prediction of buffer size, location, and delay target might only need to involve the sink representations in that cluster. Such priors are integrated into the buffer insertion model 150 by constructing attention masks for the self-attention modules 316, 322, and 328 according to the clustering results 314.

As shown, the self-attention modules 316, 322, and 328 take as inputs attention masks generated according to the clustering results 314. Along with the fully connected layers 318, 324, and 330, the self-attention modules 316, 322, and 328 generate a buffer size 320, buffer location 326, and delay target 332 for each of one or more buffers to insert into the tree. Illustratively, the buffer size(s) 320 output by the fully connected layer 324 is also input into the self-attention module 322 in order to predict the buffer location(s) 326, and the buffer location(s) 326 output by the fully connected layer 330 is also input into the self-attention module 328 in order to predict the delay target(s) 322.

Figure 4A:
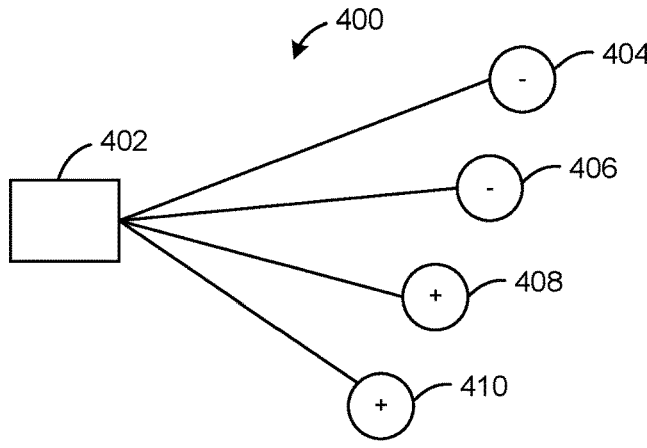
FIGS. 4A-4C illustrate how an exemplar layer of a buffer-embedded tree associated with a net is generated, according to various embodiments.
Figure 4B:
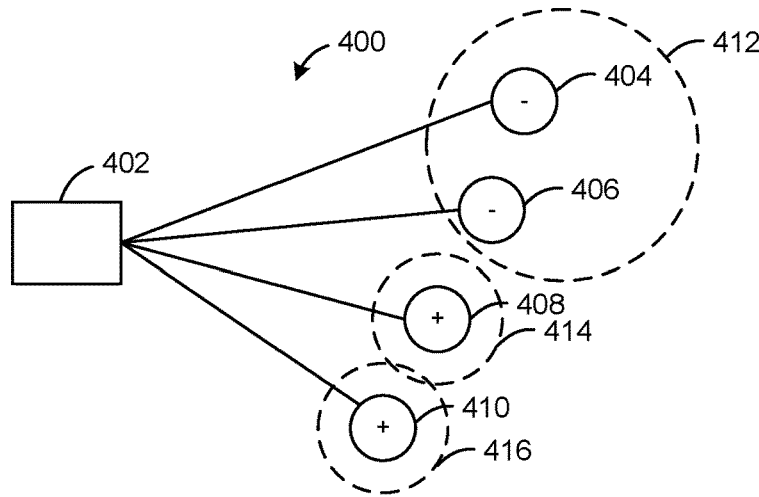
Figure 4C:
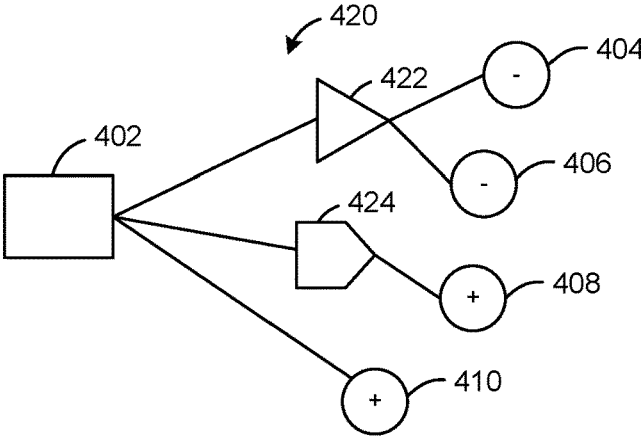

FIGS. 4A-4C illustrate how an exemplar layer of a buffer-embedded tree associated with a net is generated, according to various embodiments. In some embodiments, such a tree is generated via a clustering-based tree generation process that is guided by the buffer insertion model 150. As a general matter, the buffer insertion problem can be defined as follows. Given as inputs (1) a driver cell, its location and input slew; (2) a set of sinks and, for each sink, its parity, location, and the delay target from the input pin of the driver to the sink; (3) a library of buffers and inverters; (4) the timing information and input capacitance for each cell, including the buffer/inverter cells; and (5) electrical information about wiring for estimating resistance and capacitance, the goal is to determine a buffer-embedded tree such that the total cost (measured by the total buffer/inverter areas) is minimized while the delay targets, parity constraint (i.e., the number of inverters on the path from the driver to the sink is even if and only if the sink has parity+), capacitance, and slew limits are satisfied. Cell timing in particular can be estimated via a look-up table, and wire delay can be estimated using, e.g., the Elmore delay analysis model.

In some embodiments, to solve the buffer insertion problem described above, the buffer insertion model 150 is used in a clustering-based generation process to generate a buffer-embedded tree. In such cases, the clustering-based tree generation process can be a recursive process that begins with a tree that includes only nodes representing a driver and sinks. FIG. 4A shows an exemplar tree 400 that includes a driver node 402 and sink nodes 404, 406, 408, and 410. Nodes representing buffers can be recursively inserted into such a tree to improve the performance of a net associated with the tree. Generating the buffer-embedded tree recursively ensures satisfaction of the constraint that the tree must have the driver cell as the root node and the sinks as leaf nodes of the tree.

The clustering-based tree generating process is also a layer-by-layer bottom-up process that inserts buffers in a bottom-up manner. The height of each node in the buffer-embedded tree is defined as the number of edges on the longest path from the driver to a sink, and a layer of buffers is defined as a set of buffers having the same height. Notably, a buffer-embedded tree of height N can be constructed in N steps.

In addition, the clustering-based tree generating process constructs the buffer-embedded tree in a hierarchical clustering manner. In the clustering-based tree generating process, the buffer insertion model aggregates the input information on the driver and the sinks, described above, to determine which sinks to cluster and whether to insert a buffer for each cluster. Accordingly, the decision for one cluster correlates to the decisions for other clusters. In some embodiments, the clustering technique described above in conjunction with FIG. 3 can be used to cluster sinks. FIG. 4B illustrates an exemplar clustering of the sinks of nodes 404, 406, 408, and 410. As shown, the buffer insertion model 150 has clustered the sinks of nodes 404 and 406 into a cluster 412, and the sinks of nodes 408 and 410 are clustered in their own clusters 414 and 416, respectively. It should be noted that one sink can also form a cluster, which enables repeater insertion along a long wire. FIG. 4C illustrates an exemplar buffer 422 inserted between the driver of node 402 and the sinks of nodes 404 and 406, and another exemplar buffer 424 inserted between the driver of node 402 and the sink of node 408. As described, the buffer insertion model 150 outputs the sizes of buffers/inverters (or that no buffer is needed) for each cluster (e.g., clusters 412, 414, and 416), the locations of the new buffers, and delay targets for the new buffers, given features associated with the driver and sinks as inputs.

After the first layer is constructed, the delay targets of the new buffers are updated, and the new buffers are considered as dummy sinks that serve, along with the driver and other sinks for which no new buffers were required, as input to the next layer of buffering. The reason is that the new buffers will shield the effects of downstream cells/wires, and the delay targets only need to be updated by considering the delays of downstream cells/wires. Note that if no buffer is required for a cluster of sinks, then sinks in that cluster are untouched and will go through to the next layer of buffering. The stopping condition for the clustering-based tree generating process is that no more buffers are required for any cluster.

Figure 5A:
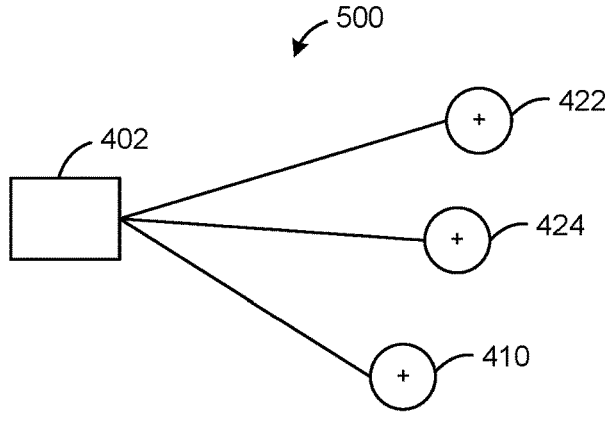
FIGS. 5A-5C illustrate how another exemplar layer of a buffer-embedded tree associated with a net is generated, according to various other embodiments.
Figure 5B:
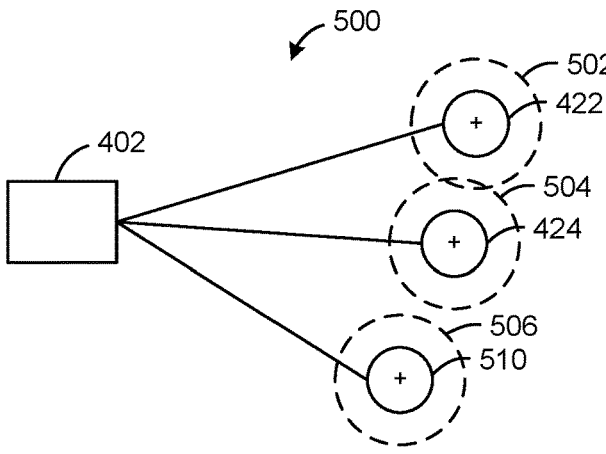
Figure 5C:
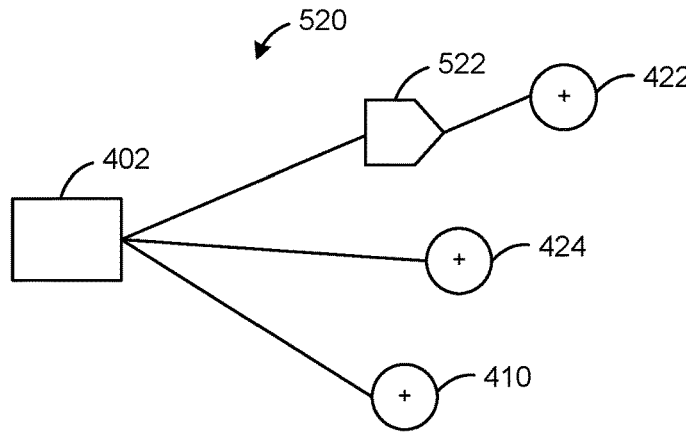

FIGS. 5A-5C illustrate how another exemplar layer of a buffer-embedded tree associated with a net is generated, according to various other embodiments. As shown in FIG. 5A, an exemplar tree 500 at a second layer of buffering includes the driver of node 402, the sink of node 410, and the buffers of nodes 422 and 424 that are dummy sinks replacing the sinks of nodes 404 and 406 and the sink of node 408, respectively. FIG. 5B illustrates an exemplar clustering of the buffers of nodes 422 and 424 and the sink of node 410. As shown, the buffer insertion model 150 has clustered the buffers of nodes 422 and 424 and the sink of node 410 into their own clusters 502, 504, and 506, respectively. FIG. 5C illustrates an exemplar buffer of node 522 inserted between the driver of node 402 and the buffer of node 422 based on output of the buffer insertion model 150, which as described outputs the sizes of buffers/inverters (or that no buffer is needed) for each cluster (e.g., clusters 502, 504, and 506), the locations of the new buffers, and delay targets for the new buffers, given features associated with the driver and (dummy) sinks as inputs.

Figure 6A:
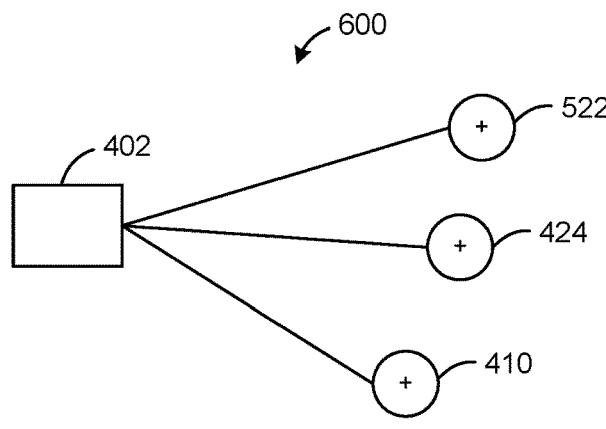
FIGS. 6A-6C illustrate an exemplar stopping condition that can arise when generating a buffer-embedded tree associated with a net, according to various embodiments.
Figure 6B:
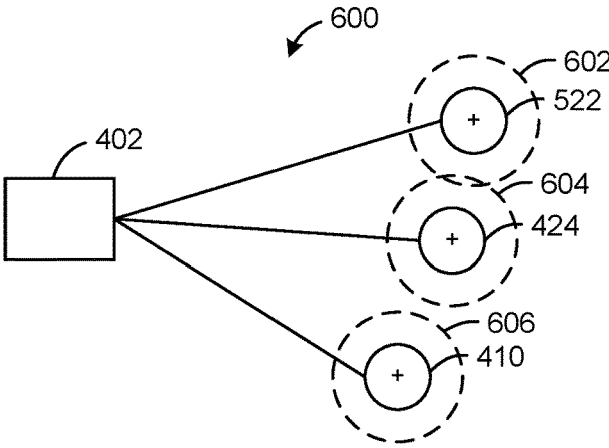
Figure 6C:
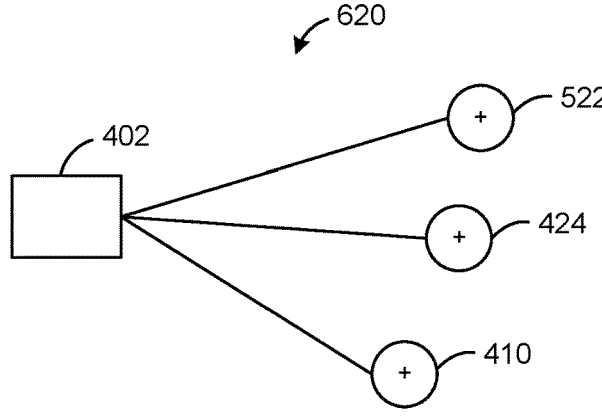

FIGS. 6A-6C illustrate an exemplar stopping condition that can arise when generating a buffer-embedded tree associated with a net, according to various embodiments. As shown in FIG. 6A, an exemplar tree 600 at a third layer of buffering includes the driver of node 402, the sink of node 410, and the buffers of nodes 522 and 424 that are dummy sinks replacing the buffer of node 422 and the sink of node 408, respectively. FIG. 6B illustrates an exemplar clustering of the buffers of nodes 522 and 424 and the sink of node 410. As shown, the buffer insertion model 150 has clustered the buffers of nodes 522 and 424 and the sink of node 410 into their own clusters 602, 604, and 606, respectively. FIG. 6C illustrates when a stopping condition of the clustering-based tree generating process is reached. As shown, the stopping condition is that no more buffers are required for any of the clusters 602, 604, or 606.

Figure 7:
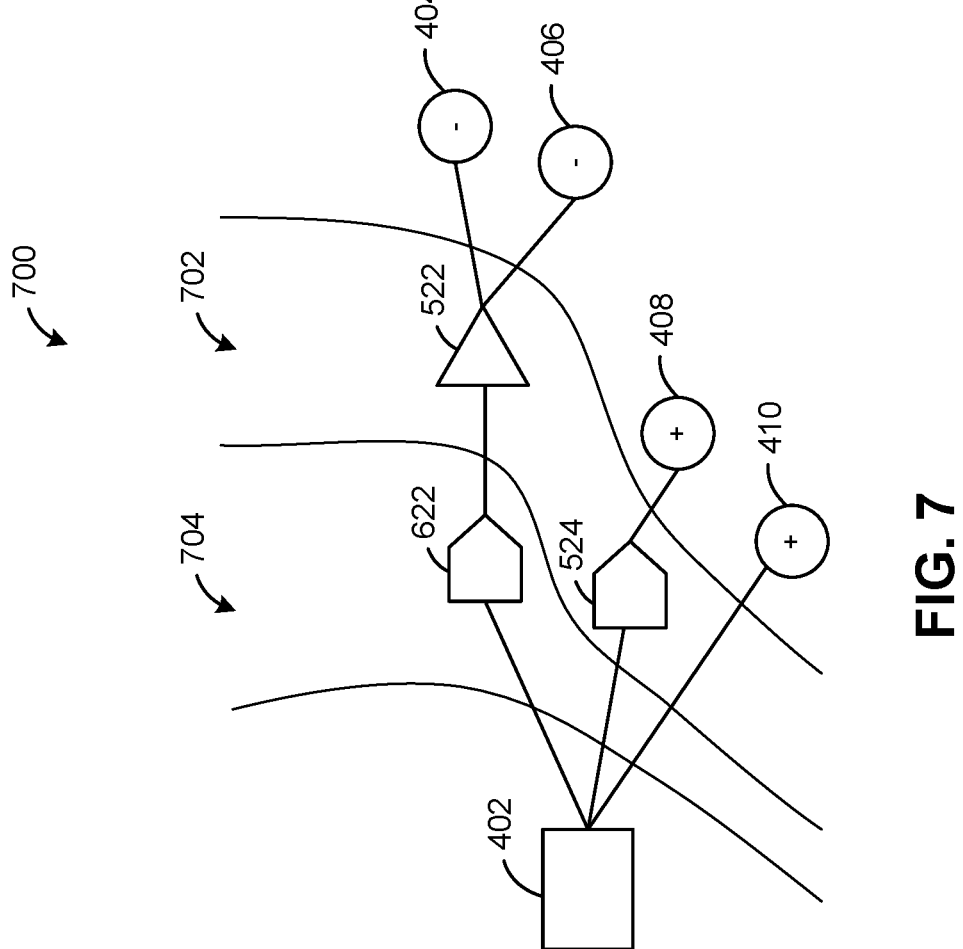
FIG. 7 illustrates an exemplar completed buffer-embedded tree associated with a net, according to various embodiments.

FIG. 7 illustrates an exemplar completed buffer-embedded tree 700 associated with a net, according to various embodiments. In some embodiments, the tree 700 can be generated via the clustering-based tree generating process described above in conjunction with FIGS. 4A-4C, 5A-5C, and 6A-6C. As shown, the tree 700 includes the driver of node 402 and the sinks of nodes 404, 406, 408, and 410. The tree 700 also includes the first layer of inserted buffers of nodes 522 and 524, described above in conjunction with FIGS. 4A-4C. In addition, the tree 700 includes the second layer of inserted buffer of node 622, described above in conjunction with FIGS. 5A-5C.

Figure 8A:
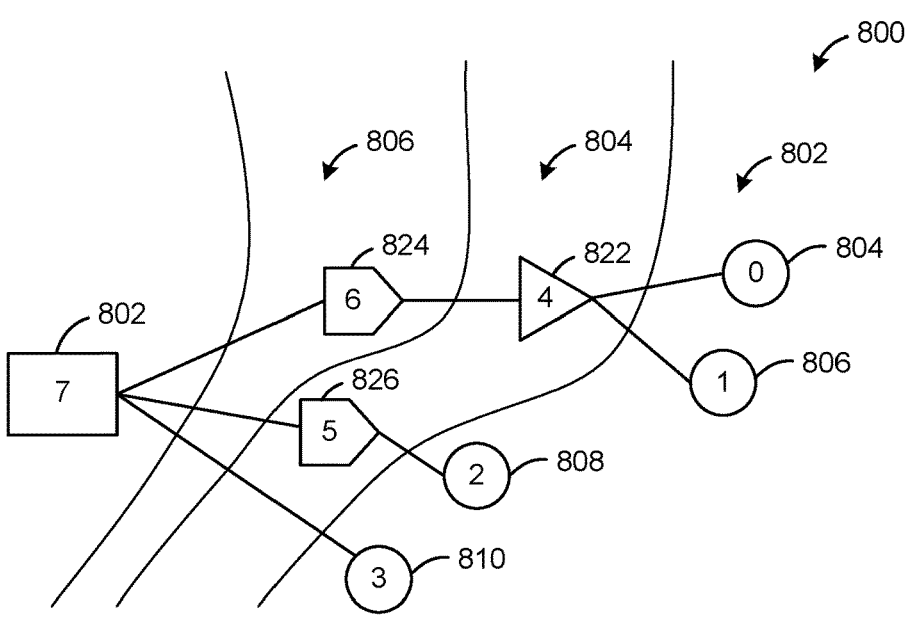
FIGS. 8A-8D illustrate how exemplar input-label pairs for training a buffer insertion machine learning model are generated, according to various embodiments.

FIGS. 8A-8D illustrate how exemplar input-label pairs for training a buffer insertion machine learning model are generated, according to various embodiments. As shown in FIG. 8A, a buffer tree sample 800 includes a driver node 802; sink nodes 804, 806, 808, and 810; and buffer nodes 822, 824, and 826 that are at three different heights 802, 804, and 806. The buffer tree sample 800 can be created in any technically feasible manner. For example, in some embodiments, the model trainer 116 generates buffer tree samples by inserting buffers (e.g., the buffers of nodes 822, 824, and 826) between exemplar drivers (e.g., the driver of node 802) and sinks (e.g., the sinks of nodes 804, 806, 808, and 810) using a buffering technique. In some embodiments, the buffering technique can utilize dynamic programming to solve the optimization problem of determining the sizes and locations of buffers that are inserted into trees associated with nets. For example, the buffering technique can include Steiner tree generation along with a Ginneken-Lillis stye algorithm for buffer insertion. In FIG. 8A, the sinks of nodes 804, 806, 808, and 810 have been numbered 0, 1, 2, and 3, respectively, for simplicity. In addition, the buffers of nodes 822, 824, and 826 have been numbered 4, 5, and 6, respectively, and the driver of node 802 has been numbered 7 for simplicity.

Figure 8B:
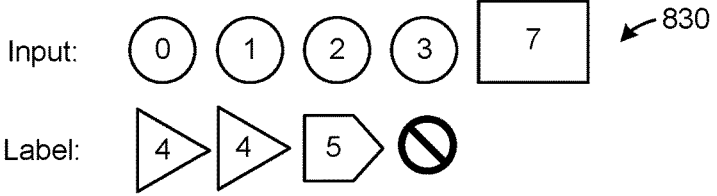

FIG. 8B illustrates an exemplar input-label pair 830 at the first height 802. As shown, the input-label pair 830 includes inputs 0, 1, 2, 3, and 7, representing the sinks of nodes 804, 806, 808, and 810 and the driver of node 802, respectively. In addition, the input-label pair 830 includes labels 4, 4, 5, and none, which correspond to the inputs 0, 1, 2, and 3, respectively. The label 4 represents the buffer of node 822, which is the buffer to the sinks of nodes 804 and 806. The label 5 represents the buffer of node 826, which is the buffer to the sink of node 808. The buffer of node 810 does not have a parent buffer, as indicated by the none label in the input-label pair 830.

More generally, given a buffer tree sample (e.g., buffer tree sample 800) that is a buffer-embedded tree, heights of nodes in the tree can be found using a depth-first search technique. For a tree of height N, N input-label pairs can be constructed. Specifically, the input in a first input-label pair (e.g., the input-label pair 830) includes the set of sinks and the driver in the buffer tree sample, and the labels in the first input-label pair include the parent buffers or none, denoting no buffer. For the i-th (1<i≤N) input-label pair, the input includes the set of drivers with height i-1, the driver, and the cells in the input set of the (i-1)-th pair that have none as the label.

Figure 8C:
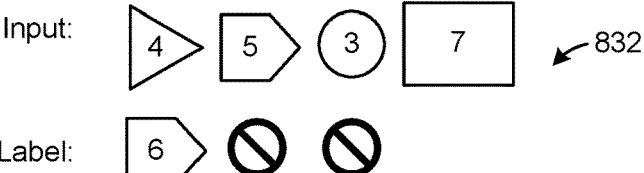
Figure 8D:
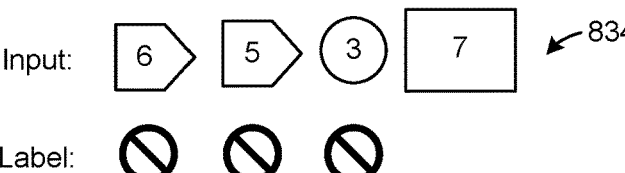

FIG. 8C illustrates an exemplar input-label pair 832 at the second height 804. As shown, the input-label pair 832 includes inputs 4, 5, 3, and 7, representing the buffers of nodes 822 and 826, the sink of node 810, and the driver of node 802, respectively. Notably, the buffer of node 822, which is the buffer to the sinks of nodes 804 and 806, has replaced the sinks of nodes 804 and 806 in the input-label pair 832. Similarly, the buffer of node 826, which is the buffer to sink of node 808, has replaced the sink of node 808 in the input-label pair 832. In addition, the input-label pair 833 includes labels 6, none, and none, which correspond to the inputs 4, 5, and 3, respectively. The label 6 represents the buffer of node 824, which is the parent buffer to the buffer of node 822. The buffer of node 826 and the sink of node 810 do not have parent buffers, as indicated by the none labels in the input-label pair 832.

FIG. 8C illustrates an exemplar input-label pair 834 at the third height 804. As shown, the input-label pair 834 includes inputs 6, 5, 3, and 7, representing the buffers of nodes 824 and 826, the sink of node 810, and the driver of node 802, respectively. Notably, the buffer of node 824, which is the parent buffer to the buffer of node 822, has replaced the buffer of node 822 in the input-label pair 834. In addition, the input-label pair 834 includes none, none, and none, which correspond to the inputs 6, 5, and 3, respectively. The buffers of nodes 824 and 826 and the sink of node 810 do not have parent buffers, as indicated by the none labels in the input-label pair 834.

In some embodiments, input-label pairs (e.g., input-label pairs 830, 832, and 834) are used as training data to train a buffer insertion model (e.g., buffer insertion model 150). That is, a self-supervised training scheme is employed that generates input-label pairs from tree samples themselves and uses the input-label pairs to train buffer insertion model 150 in a supervised learning manner. As a general matter, self-supervised learning predicts parts of data from any observed parts of the data. In the buffer insertion problem, the driver and sinks are observed parts of a buffer-embedded tree, and self-supervised learning can be utilized to predict the remaining parts of the buffer-embedded tree. Unlike conditional supervised learning or reinforcement learning techniques that require some type of labels or rewards from the environment, self-supervised learning can generate labels from samples themselves. In the buffer insertion case, archived buffer-embedded tree samples include information on what a buffer-embedded tree should look like given a driver and sinks, as well as delay targets. Self-supervised learning can use such information as "labels" to train a buffer insertion model to generate new buffer-embedded trees with the same distribution as the archived samples. In some embodiments, the supervised learning can employ a gradient-based neural network training technique to update parameters of self-attention modules (e.g., self-attention modules 304, 316, 322, and 328) and fully connected layers (e.g., fully connected layers 308, 318, 324, 330) of the buffer insertion model (e.g., buffer insertion model 150), described in greater detail below.

In some embodiments, the training solves a multi-objective optimization problem by optimizing four losses corresponding to the (1) clustering task, (2) the buffer size prediction task, (3) the buffer location prediction task, and (4) the delay target prediction task. In some embodiments, a contrastive loss is used for the clustering task in order to push sinks belonging to the same cluster closer together in a representation space while simultaneously pushing apart sinks from different clusters. In such cases, the cosine similarly between a pair of sink representations $(y_i, y_j)$ output by the buffer insertion model is calculated as follows:

$$s(y_i, y_j) = 0.5 \times \left( \frac{y_i y_j}{|y_i||y_j|} + 1 \right). \tag{2}$$

Note that $s(y_i, y_j) \in [0,1]$ for any $y_i$, $y_j$, and $s(y_i, y_j)$ can be interpreted as the probability of sinks i, j belonging to the same cluster. For notational convenience, let $$p(y_i, y_j) = \begin{cases} s(y_i, y_j) & \text{if sinks } i, j \text{ belong to the same cluster,} \\ 1 - s(y_i, y_j) & \text{otherwise.} \end{cases} \tag{3}$$

The contrastive loss for the clustering task loss can then be defined as:

$$L(y_i, y_j) = -\log [p(y_i, y_j)]. \tag{4}$$

The contrastive loss of equation (4) will push the cosine similarity $s(y_i, y_j)$ to 1 if nodes i, j belong to the same cluster and to 0 if the nodes i, j do not belong to the same cluster.

In some embodiments, a cross entropy loss enhanced by a focal loss is used for the buffer size prediction task. In such cases, the buffer size prediction task can be treated as a (M+1)-class classification problem, where M is the total number of buffers/inverters in a library and the +1 is an extra class for none. Experience has shown that, as a general matter, there is a high imbalance between the usage frequencies among different buffer/inverter library cells. A focal loss is used as an enhancement to the cross entropy loss to handle class imbalance. The raw classification output for a buffer is $z \in \{[z_0, z_1 \ldots, z_M] | 0 \le z_0, z_1, \ldots, z_M \le 1 \text{ and } z_0 + \ldots + z_M = 1\}$, which describes the probabilities of the buffer belonging to each of the M+1 classes. Denote the labels as $l \in \{0, 1, \ldots, M\}$. Then the focal loss can be calculated as follows:

$$FL(z, l) = \sum_{i=0}^{M} -(1 - p_z^i)^\gamma \log (p_z^i), \tag{5}$$

$$p_z^i = \begin{cases} z_i, & \text{if } i = 1 \\ 1 - z_i, & \text{otherwise.} \end{cases} \tag{6}$$

In equation (5), $(1-p_z^i)^\gamma$ is a modulating factor for down-weighting well-classified samples. $(1-p_z^i)^\gamma$ near 0 indicates easy to classify samples, whereas $(1-p_z^i)^\gamma$ near 1 indicates difficulty to classify samples. When a sample is misclassified and $p_z^i$ is small, the modulating factor is near 1 and the loss is unaffected. As $p_z^i \to 1$, the factor goes to 0 and the loss for well-classified samples is down-weighted. The parameter y adjusts the rate at which easy samples are down-weighted.

In some embodiments, mean-square-error losses are used for the buffer location prediction task and the delay target prediction task. It should be noted that the predicted delay target of each buffer will be used in the features for the prediction of clustering at a subsequent level during inference.

In some embodiments, a gradient-based neural network training technique that can optimize a collection of objects is employed to minimize the losses described above during training. In such cases, the for the individual modules for each task (e.g., the fully connection layers 308 for the clustering task, etc.), parameters of the module are updated according to gradients of the corresponding loss, described above. Shared parameters, which are the parameters in the self-attention module 304, are updated as follows. First, the gradients of each loss with respect to the parameters in the self-attention module 304 are computed. Then, a minimum-norm vector in the convex hull of the set of gradient vectors for the four tasks is found. Thereafter, the parameters in the self-attention module 304 are updated in the direction of the minimum norm vector. Such a gradient update essentially uses adaptive weights and optimizes an upper bound for the multi-objective loss.

FIG. 9 is a flow diagram of method steps for training a buffer insertion machine learning model, according to various embodiments. Although the method steps are described in conjunction with the system of FIGS. 1, persons skilled in the art will understand that any system configured to perform the method steps in any order falls within the scope of the present embodiments.

As shown, a method 900 begins at step 902, where the model trainer 116 generates buffer tree samples using a buffering technique. Each buffer tree sample represents a net and includes nodes representing driver, a number of sinks, and one or more buffers inserted between the driver and one or more of the sinks. As described, in some embodiments, the buffering technique can utilize dynamic programming to solve the optimization problem of determining the sizes and locations of buffers that are inserted as nodes into trees associated with nets. For example, the buffering technique can include Steiner tree generation along with a Ginneken-Lillis stye algorithm for buffer insertion.

At step 904, the model trainer 116 selects one of the buffer tree samples for further processing. At step 906, the model trainer 116 determines a height of each node representing a buffer in the selected buffer tree sample via a depth first search.

At step 908, the model trainer 116 generates, based on the determined heights of the nodes representing buffers, an input-label pair at each height. The inputs in the input-label are the driver and (dummy) sinks at the height, and the labels in the input-label pair are parent buffers for each of the (dummy) sinks, or none if no buffer is required.

At step 910, if there are additional buffer tree samples to process, then the method 900 returns to step 904, where the model trainer 116 selects another one of the buffer tree samples for further processing.

On the other hand, if there are no additional buffer tree samples to process, then the method 900 continues to step 912, where the model trainer 116 trains a buffer insertion model using the input-label pairs as training data. In some embodiments, the training solves a multi-objective optimization problem by minimizing, via a gradient-based neural network training technique, a contrastive loss corresponding to the clustering task, a focal loss corresponding to the buffer size prediction task, and mean-square-error losses corresponding to the buffer location prediction and delay target prediction tasks, as described above in conjunction with FIGS. 8A-8D.

Figure 10:
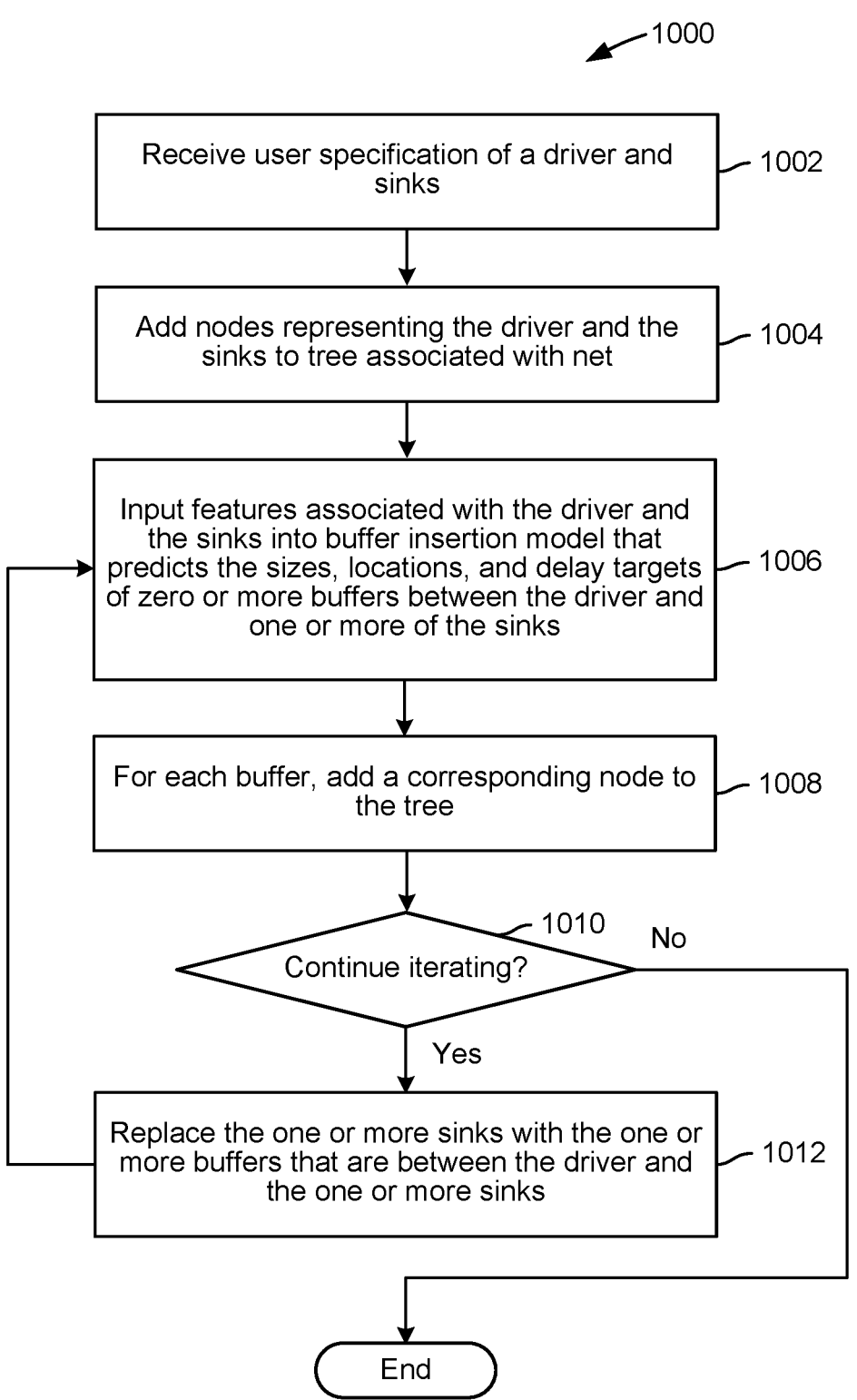
FIG. 10 is a flow diagram of method steps for applying a trained buffer insertion machine learning model to generate a buffer-embedded tree for a net, according to various embodiments.

FIG. 10 is a flow diagram of method steps for applying a trained buffer insertion machine learning model to generate a buffer-embedded tree for a net, according to various embodiments. Although the method steps are described in conjunction with the systems of FIGS. 1-3, persons skilled in the art will understand that any system configured to perform the method steps in any order falls within the scope of the present embodiments.

As shown, a method 1000 begins at step 1002, where the circuit design application 146 receives a user specification of a driver and sinks. The user can specify the driver and the sinks in any technically feasible manner, such as via a graphical user interface (GUI).

At step 1004, the circuit design application 146 adds nodes representing the driver and the sinks to a tree associated with a net. As described, the net represents the connection between a set of pins in a circuit.

At step 1006, the circuit design application 146 inputs features associated with the driver and the sinks into the buffer insertion model 150, which predicts the sizes, locations, and delay targets of zero or more buffers between the driver and one or more of the sinks. An exemplar architecture of the buffer insertion model 150 is described above in conjunction with FIG. 3. Techniques for generating training data and training the buffer insertion model 150 are described above in conjunction with FIGS. 8A-8D and 9.

At step 1008, the circuit design application 146 adds, for each buffer predicted at step 1006, a corresponding node to the tree associated with the net. Each corresponding node is added between the node representing the driver and one or more nodes representing one or more sinks based on the output of the buffer insertion model 150.

At step 1010, if the circuit design application 146 determines to continue iterating, then the method 1000 continues to step 1008, where the circuit design application 146 replaces the one or more sinks with the one or more buffers determined at step 1004.

The method 1000 then returns to step 1006, where the circuit design application 146 inputs features associated with the driver and the sinks, including the one or more buffers that have replaced the previous one or more sinks, into the buffer insertion model 150.

On the other hand, if the circuit design application 146 determines at step 1006 to stop iterating, then the method 1000 ends. In some embodiments, the stopping condition is that no more buffers are required for any cluster.

After a buffer-embedded tree is generated according to the method 1000 for each of one or more nets associated with one or more drivers and sinks that are specified by a user, the circuit design application 146 can generate a circuit design based on the buffer-embedded tree(s). The circuit design can include one or more drivers, sinks, and buffers having properties and being placed at locations according to the buffer-embedded tree(s).

In sum, techniques are disclosed for training and using a machine learning model to generate designs of circuits that include buffers. In some embodiments, a buffer-embedded tree for a net is generated via a recursive process in which a buffer insertion machine learning model is applied, at a number of levels, to insert nodes representing buffers between nodes representing a driver and sinks in the tree. At a first level, features associated with the driver and the sinks are inserted into the buffer insertion model. The buffer insertion model clusters the sinks and predicts, for each cluster of sinks, the size of a new buffer (or that no new buffer is required), a location of the new buffer, and a delay target for the new buffer. At subsequent levels, the new buffers, if any, are considered as dummy sinks. Features associated with the new buffers are input, along with features associated with the driver and other sinks for which no new buffers were required, into the buffer insertion model to generate additional buffers for the subsequent levels. Once a tree is generated for each of one or more nets, a circuit design can be generated based on the tree(s).

In some embodiments, the buffer insertion model is trained via a self-supervised training scheme in which embedded tree samples are generated using a buffering technique, such as a conventional dynamic programming technique. Then, input-label pairs are generated from the tree samples and used as training data to train the buffer insertion model.

At least one technical advantage of the disclosed techniques relative to the prior art is that the disclosed techniques can be used to generate designs of circuits that include buffers in less time, and using less computational resources, than conventional techniques. The disclosed techniques also scale better than conventional techniques for circuits that include a large number of pins, because the disclosed techniques permit a buffer-embedded tree of height N to be constructed in N steps. These technical advantages represent one or more technological improvements over prior art approaches.

1. In some embodiments, a computer-implemented method for designing a circuit comprises receiving a specification for a driver and a plurality of sinks, executing, based on the driver and the plurality of sinks, a machine learning model that predicts at least one of a size, a location, or a delay target of one or more buffers, generating a tree that includes a plurality of nodes representing the driver, the plurality of sinks, and the one or more buffers between the driver and one or more of the sinks, and generating a design of a circuit based on the tree.

2. The computer-implemented method of clause 1, wherein the one or more buffers are disposed between the driver and a first set of sinks included in the plurality of sinks.

3. The computer-implemented method of clauses 1 or 2, further comprising executing, based on the driver, the first set of buffers, and a second set of sinks included in the plurality of sinks, the machine learning model to predict at least one of a size, a location, or a delay target of one or more additional buffers.

4. The computer-implemented method of any of clauses 1-3, wherein executing the machine learning model comprises generating, via one or more layers of the machine learning model, a plurality of representations associated with the plurality of sinks, clustering one or more sinks included in the plurality of sinks based on the plurality of representations to generate a cluster of sinks, and determining the at least one of a size, a location, or a delay target of the one or more buffers based on the clustering of the one or more sinks.

5. The computer-implemented method of any of clauses 1-4, wherein the machine learning model includes at least one of a self-attention layer or a sequence-to-sequence mapping layer.

6. The computer-implemented method of any of clauses 1-5, wherein the machine learning model comprises one or more first attention layers and a first fully connected layer that generate a representation of the plurality of sinks, a clustering component that clusters the plurality of sinks based on the representation of the plurality of sinks to generate one or more clusters of sinks, and one or more attention layers and one or more fully connected layers that predict the at least one of a size, a location, or a delay target of the one or more buffers.

7. The computer-implemented method of any of clauses 1-6, further comprising determining one or more pairs of inputs and outputs based on one or more trees, wherein each tree includes at least one node representing a buffer, and training the machine learning model based on the one or more pairs of inputs and outputs.

8. The computer-implemented method of any of clauses 1-7, further comprising performing one or more dynamic programming operations to generate the one or more trees.

9. The computer-implemented method of any of clauses 1-8, wherein training the machine learning model comprises minimizing at least one of a contrastive loss, a cross entropy loss, a focal loss, or a mean-square-error loss.

10. The computer-implemented method of any of clauses 1-9, wherein the circuit comprises a very large scale integration (VLSI) circuit.

11. In some embodiments, one or more non-transitory computer-readable media store program instructions that, when executed by at least one processor, cause the at least one processor to perform the steps of receiving a specification for a driver and a plurality of sinks, executing, based on the driver and the plurality of sinks, a machine learning model that predicts at least one of a size, a location, or a delay target of one or more buffers, generating a tree that includes a plurality of nodes representing the driver, the plurality of sinks, and the one or more buffers between the driver and one or more of the sinks, and generating a design of a circuit based on the tree.

12. The one or more non-transitory computer-readable media of clause 11, wherein the one or more buffers are disposed between the driver and a first set of sinks included in the plurality of sinks.

13. The one or more non-transitory computer-readable media of clauses 11 or 12, wherein the instructions, when executed by the at least one processor, further cause the at least one processor to perform the step of executing, based on the driver, the first set of buffers, and a second set of sinks included in the plurality of sinks, the machine learning model to predict at least one of a size, a location, or a delay target of one or more additional buffers.

14. The one or more non-transitory computer-readable media of any of clauses 11-13, wherein executing the machine learning model comprises generating, via one or more layers of the machine learning model, a plurality of representations associated with the plurality of sinks, clustering one or more sinks included in the plurality of sinks based on the plurality of representations to generate a cluster of sinks, and determining the at least one of a size, a location, or a delay target of the one or more buffers based on the clustering of the one or more sinks.

15. The one or more non-transitory computer-readable media of any of clauses 11-14, wherein the machine learning model includes a plurality of self-attention layers and fully-connected layers.

16. The one or more non-transitory computer-readable media of any of clauses 11-15, wherein the machine learning model includes a transformer-based architecture.

17. The one or more non-transitory computer-readable media of any of clauses 11-16, wherein the instructions, when executed by the at least one processor, further cause the at least one processor to perform the steps of determining one or more pairs of inputs and outputs based on one or more trees, wherein each tree includes at least one node representing a buffer, and training the machine learning model based on the one or more pairs of inputs and outputs.

18. The one or more non-transitory computer-readable media of any of clauses 11-17, wherein the instructions, when executed by the at least one processor, further cause the at least one processor to perform the step of performing one or more dynamic programming operations to generate the one or more trees.

19. The one or more non-transitory computer-readable media of any of clauses 11-18, wherein training the machine learning model comprises minimizing a plurality of losses associated with clustering sinks, predicting buffer size, predicting buffer location, and predicting delay target.

20. In some embodiments, a system comprises one or more memories storing instructions, and one or more processors that are coupled to the one or more memories and, when executing the instructions, are configured to receive a specification for a driver and a plurality of sinks, execute, based on the driver and the plurality of sinks, a machine learning model that predicts at least one of a size, a location, or a delay target of one or more buffers, generate a tree that includes a plurality of nodes representing the driver, the plurality of sinks, and the one or more buffers between the driver and one or more of the sinks, and generate a design of a circuit based on the tree.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for designing a circuit, the method comprising:

receiving a specification for a driver and a plurality of sinks;

clustering two or more sinks included in the plurality of sinks to generate at least one cluster;

executing a machine learning model that predicts at least one of a size, a location, or a delay target of one or more buffers to be inserted between the driver and one or more of the plurality of sinks, wherein the machine learning model executes based on the driver, the at least one cluster, and the plurality of sinks;

generating a tree that includes a plurality of nodes representing the driver, the plurality of sinks, and the one or more buffers between the driver and one or more of the sinks; and generating a design of the circuit based on the tree.

2. The computer-implemented method of claim 1, wherein a first set of buffers included in the one or more buffers are disposed between the driver and a first set of sinks included in the plurality of sinks.

3. The computer-implemented method of claim 2, further comprising executing the machine learning model to predict at least one of a size, a location, or a delay target of one or more additional buffers to be inserted between the driver and a second set of sinks included in the plurality of sinks, wherein the machine learning model executes based on the driver, the first set of buffers, and the second set of sinks.

4. The computer-implemented method of claim 1, wherein executing the machine learning model comprises:

generating, via one or more layers of the machine learning model, a plurality of representations associated with the plurality of sinks, wherein clustering the two or more sinks included in the plurality of sinks is based on the plurality of representations; and determining the at least one of the size, the location, or the delay target of the one or more buffers based on the clustering of the two or more sinks to generate a prediction.

5. The computer-implemented method of claim 1, wherein the machine learning model includes at least one of a self-attention layer or a sequence-to-sequence mapping layer.

6. The computer-implemented method of claim 1, wherein the machine learning model comprises:

one or more first attention layers and a first fully connected layer that generate a representation of the plurality of sinks;

a clustering component that clusters the plurality of sinks based on the representation of the plurality of sinks to generate the at least one cluster; and one or more attention layers and one or more fully connected layers that predict the at least one of the size, the location, or the delay target of the one or more buffers.

7. The computer-implemented method of claim 1, further comprising:

determining one or more pairs of inputs and outputs based on one or more trees, wherein each tree includes at least one node representing a buffer; and training the machine learning model based on the one or more pairs of inputs and outputs.

8. The computer-implemented method of claim 7, further comprising performing one or more dynamic programming operations to generate the one or more trees.

9. The computer-implemented method of claim 7, wherein training the machine learning model comprises minimizing at least one of a contrastive loss, a cross entropy loss, a focal loss, or a mean-square-error loss.

10. The computer-implemented method of claim 1, wherein the circuit comprises a very large scale integration (VLSI) circuit.

11. One or more non-transitory computer-readable media storing program instructions that, when executed by at least one processor, cause the at least one processor to perform the steps of:

receiving a specification for a driver and a plurality of sinks;

clustering two or more sinks included in the plurality of sinks to generate at least one cluster;

executing a machine learning model that predicts at least one of a size, a location, or a delay target of one or more buffers to be inserted between the driver and one or more of the plurality of sinks, wherein the machine learning model executes based on the driver, the at least one cluster, and the plurality of sinks;

generating a tree that includes a plurality of nodes representing the driver, the plurality of sinks, and the one or more buffers between the driver and one or more of the sinks; and generating a design of a circuit based on the tree.

12. The one or more non-transitory computer-readable media of claim 11, wherein a first set of buffers included in the one or more buffers are disposed between the driver and a first set of sinks included in the plurality of sinks.

13. The one or more non-transitory computer-readable media of claim 12, wherein the instructions, when executed by the at least one processor, further cause the at least one processor to perform the step of executing the machine learning model to predict at least one of a size, a location, or a delay target of one or more additional buffers to be inserted between the driver and a second set of sinks included in the plurality of sinks, wherein the machine learning model executes based on the driver, the first set of buffers, and the second set of sinks.

14. The one or more non-transitory computer-readable media of claim 11, wherein executing the machine learning model comprises:

generating, via one or more layers of the machine learning model, a plurality of representations associated with the plurality of sinks, wherein clustering the two or more sinks included in the plurality of sinks is based on the plurality of representations; and determining the at least one of the size, the location, or the delay target of the one or more buffers based on the clustering of the two or more sinks to generate a prediction.

15. The one or more non-transitory computer-readable media of claim 11, wherein the machine learning model includes a plurality of self-attention layers and fully-connected layers.

16. The one or more non-transitory computer-readable media of claim 11, wherein the machine learning model includes a transformer-based architecture.

17. The one or more non-transitory computer-readable media of claim 11, wherein the instructions, when executed by the at least one processor, further cause the at least one processor to perform the steps of:

determining one or more pairs of inputs and outputs based on one or more trees, wherein each tree includes at least one node representing a buffer; and training the machine learning model based on the one or more pairs of inputs and outputs.

18. The one or more non-transitory computer-readable media of claim 11, wherein the instructions, when executed by the at least one processor, further cause the at least one processor to perform the step of performing one or more dynamic programming operations to generate the one or more trees.

19. The one or more non-transitory computer-readable media of claim 11, wherein training the machine learning model comprises minimizing a plurality of losses associated with at least one of clustering sinks, predicting buffer size, predicting buffer location, or predicting delay target.

20. A system, comprising:

one or more memories storing instructions; and one or more processors that are coupled to the one or more memories and, when executing the instructions, are configured to:

receive a specification for a driver and a plurality of sinks, cluster two or more sinks included in the plurality of sinks to generate at least one cluster, execute a machine learning model that predicts at least one of a size, a location, or a delay target of one or more buffers to be inserted between the driver and one or more of the plurality of sinks, wherein the machine learning model executes based on the driver, the at least one cluster, and the plurality of sinks, generate a tree that includes a plurality of nodes representing the driver, the plurality of sinks, and the one or more buffers between the driver and one or more of the sinks, and generate a design of a circuit based on the tree.

* * * * *